(12) United States Patent
Derner et al.

(10) Patent No.: US 12,114,474 B2
(45) Date of Patent: Oct. 8, 2024

(54) INTEGRATED MEMORY COMPRISING SECONDARY ACCESS DEVICES BETWEEN DIGIT LINES AND PRIMARY ACCESS DEVICES

(71) Applicant: Micron Technology, Inc., Boise, ID (US)

(72) Inventors: Scott J. Derner, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/877,628

(22) Filed: Jul. 29, 2022

(65) Prior Publication Data
US 2022/0367465 A1 Nov. 17, 2022

Related U.S. Application Data

(63) Continuation of application No. 17/324,976, filed on May 19, 2021, now Pat. No. 11,450,668, which is a
(Continued)

(51) Int. Cl.
*G11C 11/24* (2006.01)
*G11C 11/4091* (2006.01)
(Continued)

(52) U.S. Cl.
CPC .......... *H10B 12/00* (2023.02); *G11C 11/4091* (2013.01); *G11C 11/4094* (2013.01);
(Continued)

(58) Field of Classification Search
CPC .... H10B 12/00; H10B 12/50; G11C 11/4091; G11C 11/4094; H01L 29/78; H01L 29/7827
(Continued)

(56) References Cited

U.S. PATENT DOCUMENTS

RE34,026 E * 8/1992 Duvvury ............. G11C 11/4097
327/52
5,245,230 A * 9/1993 Ohri ..................... H03K 17/102
327/427
(Continued)

FOREIGN PATENT DOCUMENTS

CN 201910730113.X 3/2023

*Primary Examiner* — Viet Q Nguyen
(74) *Attorney, Agent, or Firm* — Wells St. John P.S.

(57) ABSTRACT

Some embodiments include an integrated assembly having a primary access transistor. The primary access transistor has a first source/drain region and a second source/drain region. The first and second source/drain regions are coupled to one another when the primary access transistor is in an ON mode, and are not coupled to one another when the primary access transistor is in an OFF mode. A charge-storage device is coupled with the first source/drain region. A digit line is coupled with the second source/drain region through a secondary access device. The secondary access device has an ON mode and an OFF mode. The digit line is coupled with the charge-storage device only when both the primary access transistor and the secondary access device are in their respective ON modes.

28 Claims, 6 Drawing Sheets

Related U.S. Application Data continuation of application No. 16/514,693, filed on Jul. 17, 2019, now Pat. No. 11,031,400.

(60) Provisional application No. 62/717,636, filed on Aug. 10, 2018.

(51) Int. Cl.
 *G11C 11/4094* (2006.01)
 *H01L 29/78* (2006.01)
 *H10B 12/00* (2023.01)

(52) U.S. Cl.
 CPC .......... *H01L 29/78* (2013.01); *H01L 29/7827* (2013.01); *H10B 12/50* (2023.02)

(58) Field of Classification Search
 USPC ........................................................ 365/149
 See application file for complete search history.

(56) References Cited

U.S. PATENT DOCUMENTS

| | | | |
|---|---|---|---|
| 5,430,400 A * | 7/1995 | Herlein | G01R 31/31924 327/108 |
| 5,495,440 A | 2/1996 | Asakura | |
| 6,256,220 B1 | 7/2001 | Kamp | |
| 6,363,003 B1 | 3/2002 | Miyamoto | |
| 6,366,116 B1 * | 4/2002 | Juang | G09G 3/3241 326/112 |
| 6,388,477 B1 * | 5/2002 | Juang | H03F 3/2173 326/82 |
| 6,724,655 B2 * | 4/2004 | King | H01L 29/788 257/E27.06 |
| 6,728,128 B2 | 4/2004 | Nishimura et al. | |
| 6,728,152 B2 | 4/2004 | Van De Graaff | |
| 6,781,867 B2 | 8/2004 | Kurth et al. | |
| 6,900,503 B2 * | 5/2005 | Oh | H10B 10/12 257/350 |
| 6,992,912 B2 | 1/2006 | Kang | |
| 7,164,595 B1 | 1/2007 | Shore et al. | |
| 7,397,283 B2 * | 7/2008 | Chiu | H04N 21/42204 375/240 |
| 7,504,298 B2 | 3/2009 | Manning et al. | |
| 7,738,312 B2 * | 6/2010 | Shimano | G11C 7/12 365/207 |
| 7,838,342 B2 * | 11/2010 | Morton | H10B 69/00 438/129 |
| 7,852,665 B2 | 12/2010 | Chen et al. | |
| 7,983,089 B2 * | 7/2011 | Morton | G11C 16/26 365/207 |
| 8,044,437 B1 * | 10/2011 | Venkatraman | H10B 10/00 257/206 |
| 8,138,035 B2 * | 3/2012 | Xiong | G11C 11/412 438/266 |
| 8,576,613 B2 * | 11/2013 | Kim | G11C 11/412 365/156 |
| 8,598,912 B2 | 12/2013 | Thompson et al. | |
| 9,378,781 B1 | 6/2016 | Jung et al. | |
| 9,383,763 B1 * | 7/2016 | Liu | G05F 3/26 |
| 9,443,588 B2 * | 9/2016 | Tseng | G11C 13/0023 |
| 10,109,637 B1 * | 10/2018 | Zang | H01L 23/5226 |
| 10,115,438 B2 * | 10/2018 | Ingalls | H01L 29/66666 |
| 10,156,859 B2 * | 12/2018 | Luria | H02M 1/088 |
| 10,262,998 B2 * | 4/2019 | Sagong | H01L 27/092 |
| 10,347,322 B1 | 7/2019 | Kim et al. | |
| 10,381,378 B1 * | 8/2019 | Harari | G11C 16/14 |
| 10,396,145 B2 | 8/2019 | Balakrishnan et al. | |
| 10,475,812 B2 * | 11/2019 | Harari | H01L 23/528 |
| 10,510,385 B2 * | 12/2019 | Hu | G11C 11/419 |
| 10,573,355 B2 * | 2/2020 | Jamali | G11C 11/4091 |
| 10,762,944 B2 | 9/2020 | Bedeschi et al. | |
| 10,790,023 B2 * | 9/2020 | Harari | G11C 16/0483 |
| 10,811,083 B2 | 10/2020 | Derner et al. | |
| 10,854,617 B2 | 12/2020 | Derner et al. | |
| 10,867,675 B2 | 12/2020 | Derner et al. | |
| 10,957,681 B1 | 3/2021 | Fujisawa et al. | |
| 11,031,400 B2 | 6/2021 | Derner et al. | |
| 11,049,879 B2 * | 6/2021 | Harari | H01L 29/0649 |
| 11,264,394 B2 | 3/2022 | Derner et al. | |
| 2002/0053694 A1 | 5/2002 | Sutcliffe | |
| 2003/0123312 A1 | 7/2003 | Graaff | |
| 2008/0068876 A1 * | 3/2008 | Sandhu | H01L 29/0676 257/E21.654 |
| 2009/0231907 A1 | 9/2009 | Bloch et al. | |
| 2011/0299325 A1 * | 12/2011 | Kim | G11C 11/412 365/156 |
| 2013/0100723 A1 | 4/2013 | Takemura | |
| 2018/0061834 A1 | 3/2018 | Derner et al. | |
| 2018/0061836 A1 | 3/2018 | Mathew et al. | |
| 2020/0052070 A1 | 2/2020 | Derner et al. | |
| 2020/0286906 A1 | 9/2020 | Karda et al. | |

* cited by examiner

INTEGRATED MEMORY COMPRISING SECONDARY ACCESS DEVICES BETWEEN DIGIT LINES AND PRIMARY ACCESS DEVICES

RELATED PATENT DATA

This patent is a continuation of and claims priority to U.S. patent application Ser. No. 17/324,976, filed May 19, 2021, which is a continuation of and claims priority to U.S. patent application Ser. No. 16/514,693, filed Jul. 17, 2019, now U.S. Pat. No. 11,031,400, issued Jun. 8, 2021, which claims the benefit of U.S. Provisional Patent Application Ser. No. 62/717,636, filed Aug. 10, 2018, the disclosures of which are all incorporated by reference herein.

TECHNICAL FIELD

Integrated memory comprising secondary access devices between digit lines and primary access devices.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with the memory cell 2a comprising a transistor T1 and a capacitor C1, and with memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

Conventional DRAM accesses all memory cells along a row when a wordline is activated. In some applications it may be desirable to selectively access only some of the memory cells along the row, or even just a single memory cell (i.e., a single bit). It would be desirable to develop DRAM architectures which enable access of specific memory cells along an activated row.

DETAILED DESCRIPTION OF THE ILLUSTRATED EMBODIMENTS

Some embodiments include integrated assemblies having memory cells which each include a primary access device (e.g., a first transistor) which gatedly couples a charge-storage device (e.g., a capacitor) with a digit line. The primary access devices are arranged in rows, and all of primary access devices along a given row are switched from an OFF mode to an ON mode when the row is activated. Secondary access devices (e.g., second transistors) are provided between the primary access devices and the digit lines. The secondary access devices may be utilized to selectively couple the digit lines to only specific memory cells along an activated row. Example embodiments are described with reference to FIGS. 4-7.

Figure 4:
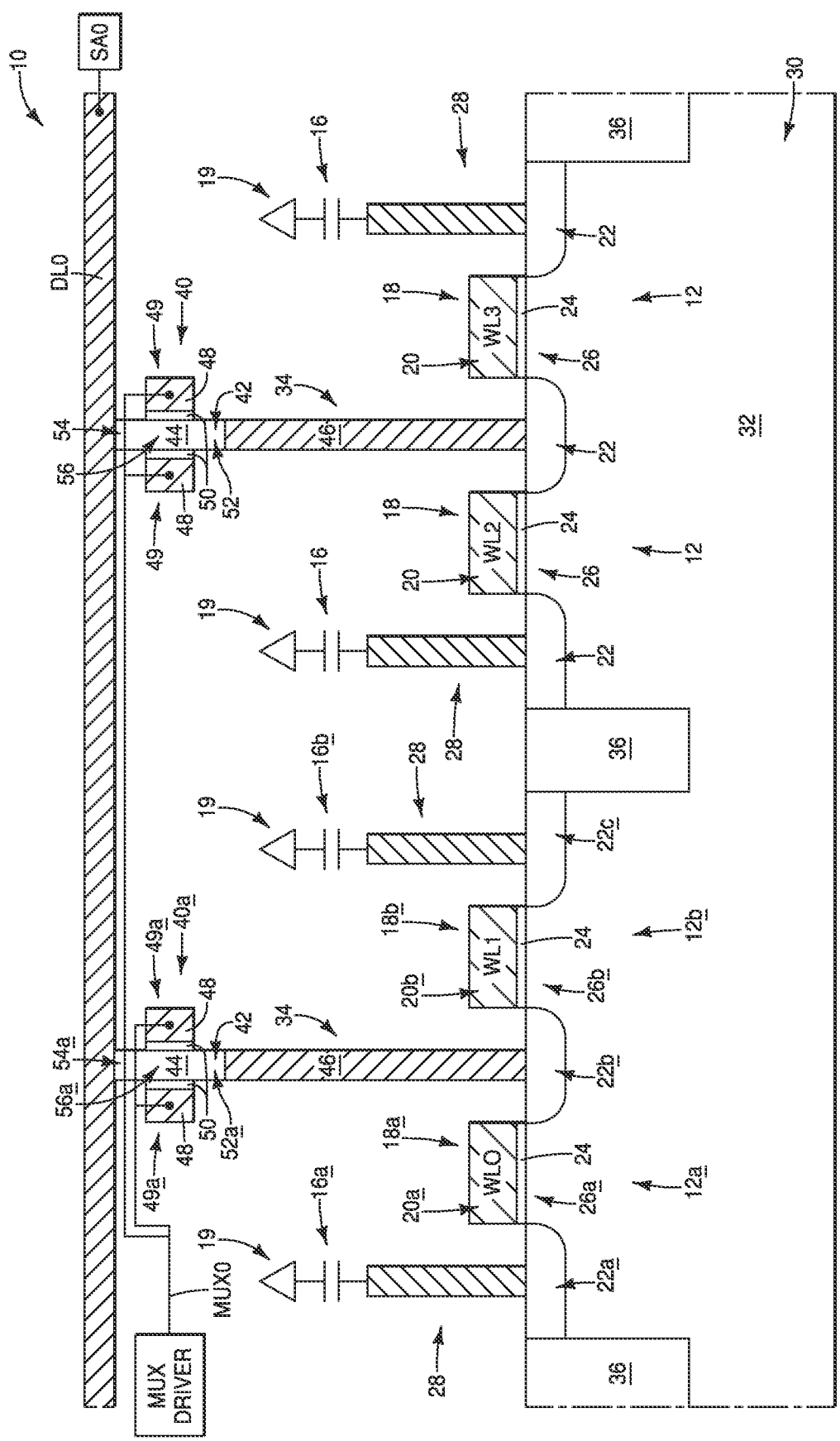
FIG. 4 is a diagrammatic cross-sectional side view showing a region of an example integrated assembly.

Referring to FIG. 4, a memory array 10 includes a plurality of memory cells 12. Each of the memory cells comprises a capacitor 16 and a transistor 18. The capacitors 16 may be considered to be examples of charge-storage devices which may be utilized in the memory cells 12. In other embodiments, other suitable charge-storage devices may be utilized; with examples of other suitable charge-storage devices including phase change materials, conductive-bridging materials, etc. The transistors 18 are access devices, and may be referred to as primary access devices (or as primary access transistors) to distinguish them from other access devices discussed below.

Figure 1:
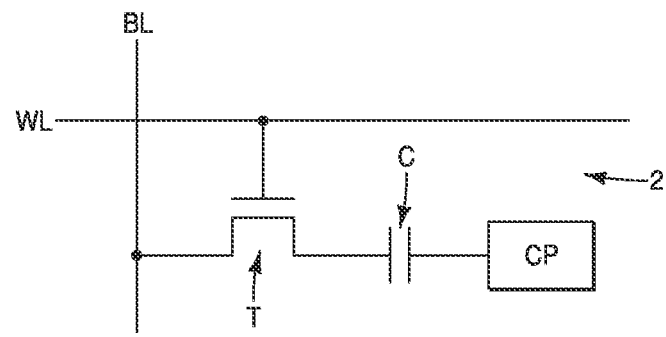
FIG. 1 is a schematic diagram of a prior art memory cell having 1 transistor and 1 capacitor.
Figure 2:
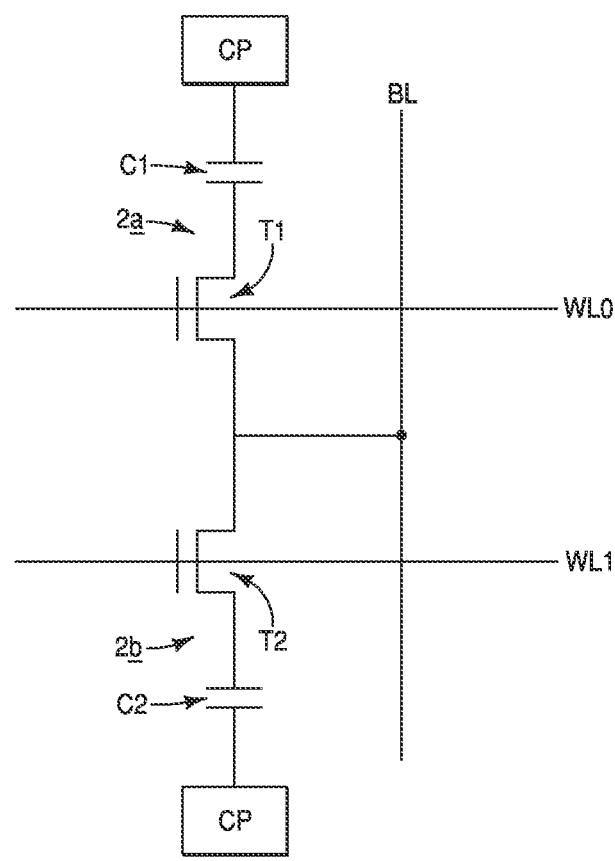
FIG. 2 is a schematic diagram of a pair of prior art memory cells which each have 1 transistor and 1 capacitor, and which share a bitline connection.
Figure 3:
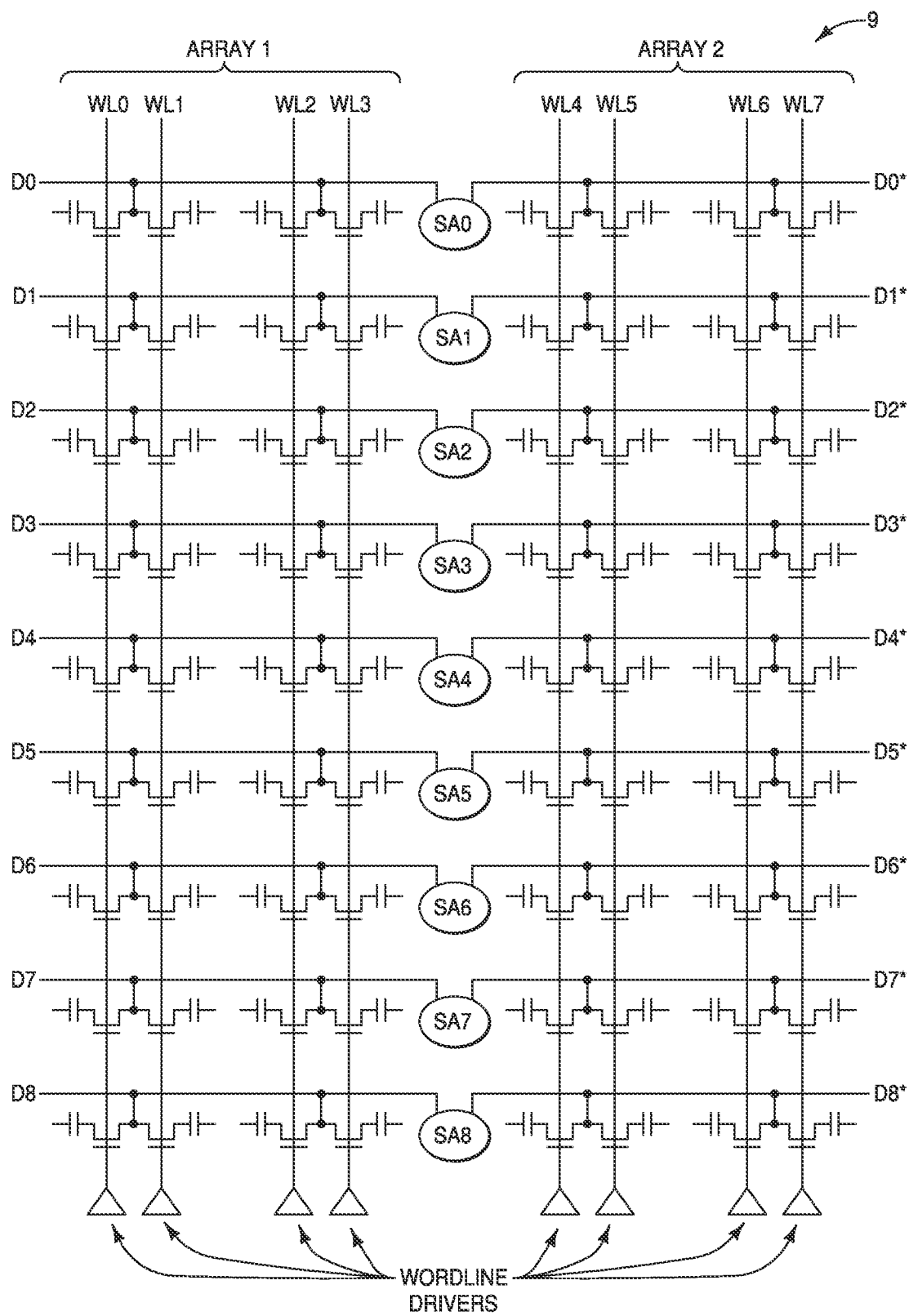
FIG. 3 is a schematic diagram of a prior art integrated assembly having open bitline architecture.

The capacitors 16 have nodes connected to reference structures 19. The reference structures may comprise any suitable voltage, and in some embodiments may correspond to common plates of the type described above with reference to FIGS. 1 and 2.

The primary access devices 18 and capacitors 16 are supported by a base 30 comprising semiconductor material 32. The semiconductor material 32 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, the semiconductor material 32 may comprise, consist essentially of, or consist of monocrystalline silicon.

The base 30 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 30 may correspond to a semiconductor substrate containing one or more materials associated with integrated circuit fabrication. Such materials may include, for example, one or more of refractory metal materials, barrier materials, diffusion materials, insulator materials, etc.

The illustrated primary access transistors have gates 20 along wordlines WL0-WL3, and have source/drain regions 22 extending into the semiconductor material 32 of the base 30. The source/drain regions may comprise conductively-doped regions within the semiconductor material 32.

The gates 20 are spaced from the semiconductor material 32 by dielectric material insulative material) 24. The dielectric material 24 may comprise any suitable composition(s); and in some embodiments may comprise, consist essentially of, or consist of silicon dioxide. The dielectric material 24 may be referred to as gate dielectric material.

The primary access transistors 18 have channel regions 26 beneath the gates 20; and the source/drain regions of each of the transistors are gatedly coupled to one another through the channel region between them. In the illustrated embodiment, the channel regions 26 extend horizontally between the source/drain regions 22.

The capacitors 16 are coupled with vertically-extending interconnects 28, which in turn are coupled with some of the source/drain regions 22. Others of the source/drain regions 22 are coupled with a digit line DL0 through vertically-extending interconnects 34. The interconnects 28 and 34 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The digit line DL0 extends to a sense amplifier SA0.

The primary access transistors 18 are in paired relationships such that two adjacent transistors share a common connection to the digit line DL0. For instance, two of the primary access transistors are labeled as 18a and 18b, and such primary access transistors are paired with one another. The primary access transistors 18a and 18b may be referred to as first and second primary access transistors, respectively. The primary access transistors 18a and 18b together comprise three source/drain regions (labeled 22a, 22b and 22c). The source/drain regions 22a, 22b and 22c may be referred to as first, second and third source/drain regions respectively. The second source/drain region 22b is shared between the first and second primary access transistors 18a and 18b, and is coupled with the digit line DL0. The first source/drain region is coupled with a first capacitor (labeled 16a), and the third source/drain region is coupled with a second capacitor (labeled 16b).

The channel regions of the first and second primary access transistors 18a and 18b are labeled 26a and 26b, and may be referred to as first and second channel regions, respectively.

The memory cells comprising the first and second primary access transistors 18a and 18b are labeled as memory cells 12a and 12b, and may be referred to as first and second memory cells, respectively.

In operation, each of the primary access transistors (e.g., transistor 18a) has an OFF mode and an ON mode. The ON mode is a state in which there is a sufficient electric field applied to the channel region of the primary access transistor (e.g., channel region 26a) so that the channel region couples the source/drain regions of the transistor (e.g., the source/drain regions 22a and 22b) with one another. The OFF mode is a state in which there is insufficient electric field applied to the channel region of the primary access transistor to couple the source/drain regions of the primary access transistor to one another. The primary access transistors are along rows (i.e., the rows defined by the wordlines WL0, WL1, WL2 and WL3). When a row is activated, sufficient voltage is applied along the wordline of the row so that all of the primary access transistors along the row are switched from the OFF mode to the ON mode; and when rows are not activated the transistors along the rows are in the OFF mode.

Isolation material 36 extends into the base 30 and separates paired-transistor arrangements from one another. The isolation material 36 may comprise any suitable composition(s); and in some embodiments may comprise, consist essentially of, or consist of silicon oxide.

In conventional DRAM configurations, the digit line DL0 would be directly coupled to source/drain regions of the primary access transistors (e.g., would be directly coupled to the source/drain region 22b). When a row is activated (e.g., the row comprising wordline WL0), all of the primary access transistors along the row (e.g., the primary access transistor 18a) are transitioned from the OFF mode to the ON mode (e.g., the gate 20a would provide a suitable electric field across the channel 26a to couple the source/drain regions 22a and 22b), and all memory cells along such row (e.g., memory cell 12a) now have their capacitor (e.g., capacitor 16a) coupled to a digit line (e.g., DL0). In contrast, the illustrated embodiment of FIG. 4 has components 40 provided along the interconnects 34 to control current flow along the interconnects 34, and to provide a mechanism for selecting specific memory cells along an activated row.

The illustrated components 40 may be referred to as secondary access devices, and in the embodiment of FIG. 4 are shown to be secondary access transistors.

The interconnects 34 are shown to include pillars 42 of semiconductor material 44. The pillars 42 extend vertically, and may be referred to as vertically-extending lengths of the semiconductor material 44. In other embodiments, the lengths of semiconductor material 44 may extend in directions other than vertically.

In the shown embodiment, each of the interconnects 34 includes a first conductive material 46 under the semiconductor material 44. The first conductive material 46 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the first material 46 may comprise a same composition as the semiconductor material 44, and may be a conductively-doped extension of the semiconductor material 44.

The semiconductor material 44 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some example embodiments, the semiconductor material 44 may comprise polycrystalline silicon.

In some embodiments, the materials 44 and 46 may be considered together to form the interconnects 34 which extend between the source/drain regions 22 and the digit line DL0. One of the interconnects 34 is labeled as 34a, and is coupled with the second source/drain region 22b. The secondary access transistor coupled with the interconnect 34a is labeled 40a.

The secondary access transistors 40 include conductive gating material 48, and include insulative material 50 between the gating material 48 and the semiconductor material 44 of the pillars 42.

The gating material 48 may comprise any suitable electrically conductive composition(s); such as, fir example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The gating material 48 is configured as transistor gates 49.

The insulative material 50 may comprise any suitable composition(s); and in some embodiments may comprise, consist essentially of, or consist of silicon dioxide. The insulative material 50 may be referred to as gate dielectric material in some embodiments.

The secondary access transistors 40 comprise source/drain regions 52 and 54, and channel regions 56 between the source/drain regions. The source/drain regions 54 may be referred to as upper source/drain regions, and the source/drain regions 52 may be referred to as lower source/drain regions. The channel regions 56 extend vertically between the upper and lower source/drain regions. In some embodiments, the secondary access transistors 40 may be referred to as vertical transistors due to the vertically-extending channel regions 56; and the primary access transistors 18 may be referred to as planar transistors due to the horizontally-extending channel regions 26. In some embodiments, the primary access transistor 18a may be considered to have first and second source/drain regions 22a and 22b which are spaced from one another by a horizontally-extending channel region 26a; and the secondary access transistor 40a may be considered to comprise third and fourth source/drain regions 52a and 54a which are spaced from one another by a vertically-extending channel region 56a.

The channel regions 56 correspond to gated portions of the pillars 42 (i.e., to gated portions of the lengths of semiconductor material 44). In some embodiments, the channel regions 56 may be referred to as gated portions of the interconnects 34.

In some embodiments, the first and second access transistors 18a and 18b may be considered to comprise first and second gates 20a and 20b, respectively; and the secondary transistor 40a may be considered to comprise a third gate 49a. In the shown embodiment, the third gate 49a is over the first and second gates 20a and 20b, and is under the digit line DL0.

In some embodiments, the secondary access transistors 40 may be considered to be examples of switches which control current flow along the interconnects 34. Such switches may be closed to enable access of the digit line DL0. In the shown embodiment, the "closing" of such switches corresponds to providing appropriate voltages to the gates 49 to enable current flow across the channel regions 56 between the source/drain regions 52 and 54.

In some embodiments, the components 40 may be considered to comprise an OFF mode and an ON mode. The ON mode is a state in which there is a sufficient electric field applied to the channel region of the secondary access transistor (e.g., channel region 56a) so that the channel region couples the source/drain regions of the transistor (e.g., the source/drain regions 52a and 54b) with one another. The OFF mode is a state in which there is insufficient electric field applied to the channel region of the secondary access transistor to couple the source/drain regions of the secondary access transistor to one another. In embodiments in which the components 40 are considered to correspond to switches, the OFF mode is a state in which a switch is "open", and the ON mode is a state in which the switch is "closed".

A memory cell (e.g., memory cell 12a) is only accessed when the associated primary access device (e.g., device 18a) is in the ON mode and the associated secondary access device (e.g., device 40a) is in the ON mode. In other words, the capacitor of the memory cell (e.g., capacitor 16a) is only coupled to an associated digit line (e.g., DL0) when both the primary access device (e.g., 18a) and the secondary access device (e.g., 40a) are in their respective ON modes. Otherwise, the capacitor of the memory cell is isolated from the associated digit line.

The secondary access transistors 40 may be controlled with any suitable circuitry. FIG. 4 shows the gates 49 of the secondary access transistors incorporated into multiplexer (mux) circuitry, and coupled with a multiplexer driver (shown as a MUX DRIVER). Such enables each of the secondary access transistors to be separately controlled relative to the others.

The various components of FIG. 4 may have any suitable architectural relationships relative to one another. For instance, although the embodiment of FIG. 4 shows the third gate 49a over the first and second gates 20a and 20b, and shows the digit line DL0 over the third gate; in other embodiments, the digit line may be placed in any other suitable location, and the various gates 20a, 20b, 49a etc., may be placed in any suitable orientation relative to one another.

Figure 5:
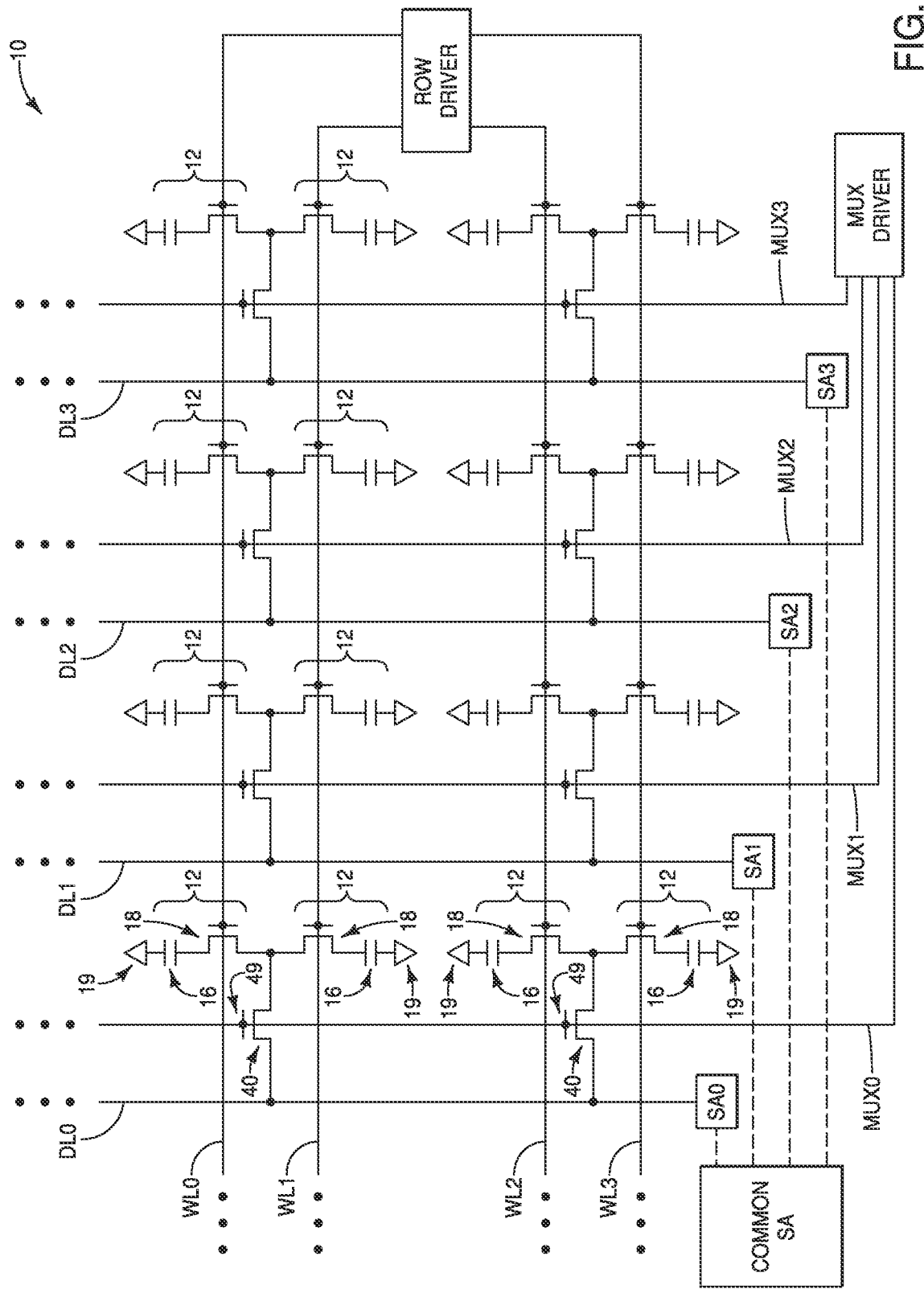
FIG. 5 is a schematic diagram illustrating a portion of an example memory array which may comprise the assembly of FIG. 4.

The memory cells 12 may be representative of a large number of substantially identical memory cells within a DRAM array; with the term "substantially identical" meaning identical to within reasonable tolerances of fabrication and measurement. FIG. 5 schematically illustrates a portion of the memory array 10, and shows a large number of substantially identical memory cells 12. Each of the memory cells comprises a primary access transistor 18 (only some of which are labeled), and a capacitor 16 (only some of which are labeled). The wordlines WL0-WL3 extend along rows of the memory array, and are coupled with gates of the primary access transistors 18. Each of the wordlines is coupled with a row driver. Digit lines DL0-DL3 extend along columns of the array and are coupled to the memory cells 12 through the secondary access transistors 40 (only some of which are labeled). The digit lines DL0-DL3 are coupled with sense amplifiers SA0-SA3.

The gates 49 (only some of which are labeled) of the secondary access transistors 40 are coupled with a multiplexer (mux) circuitry so that each of the secondary access transistors may be separately controlled. Specifically, the gates of the secondary access transistors 40 are coupled with mux lines (MUX0, MUX1, MUX2 and MUX3) which extend to a mux driver (shown as MUX DRIVER). The mux driver may be configured to address each of the gates 49 independently of the others.

Figure 6:
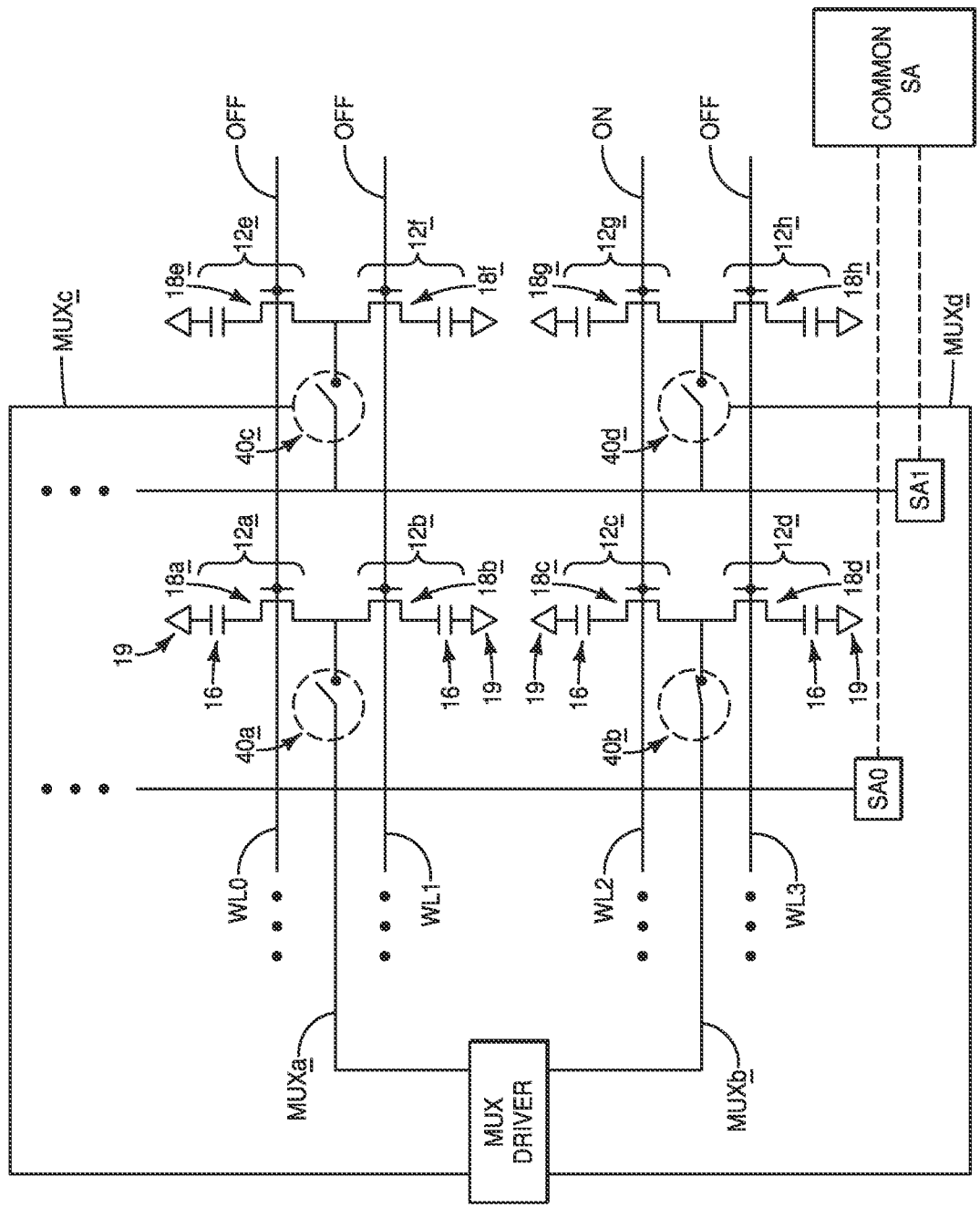
FIG. 6 is a schematic diagram illustrating an operation occurring within a region of the example memory array of FIG. 5.

An example operation utilized to specifically access one of the memory cells of the array 12 is described with reference to FIG. 6. The figure shows a schematic illustration of a region of the memory array 10, and shows the secondary access devices configured as switches to simplify the representation of OFF and ON modes of such devices. The various memory cells are labeled as 12a-12h so that they may be specifically identified relative to one another. Similarly, the various primary access gates are labeled 18a-18h, and the secondary access gates are labeled 40a-40d. The mux lines are labeled as MUXa, MUXb, MUXc and MUXd.

The wordlines WL0, WL1 and WL3 are shown to be OFF (i.e., not activated), and accordingly the primary access devices along such wordlines (devices 18a, 18b, 18d, 18e, 18f and 18h) would also be OFF. The wordline WL2 is shown to be ON (i.e., activated), and accordingly the primary access devices along such wordline (devices 18c and 18g) would also be ON.

The secondary access devices 40a and 40c are shown to be OFF, as represented by the shown switches being in open positions. The secondary access device 40d is also OFF, but the secondary access device 40b is ON (as represented by the shown switch being in a closed position). Thus the memory cell 12c is specifically selected. The ability to select one or more specific memory cells along an activated row may advantageously enable reduced power consumption as compared to conventional devices in that not all of the memory cells along the activated row are dumping data to their respective digit lines and needing to be restored. Also, the ability to select one or more memory cells with the secondary access devices 40 and the mux driver may enable a common sense amplifier to be shared amongst several digit lines. Such is diagrammatically illustrated in FIGS. 5 and 6 with dashed lines extending to an optional common sense amplifier (shown as common SA) which may be utilized in place of SA0, SA1, SA2 and SA3. In some applications, all of the digit lines of a memory array may extend to the common sense amplifier.

Figure 7:
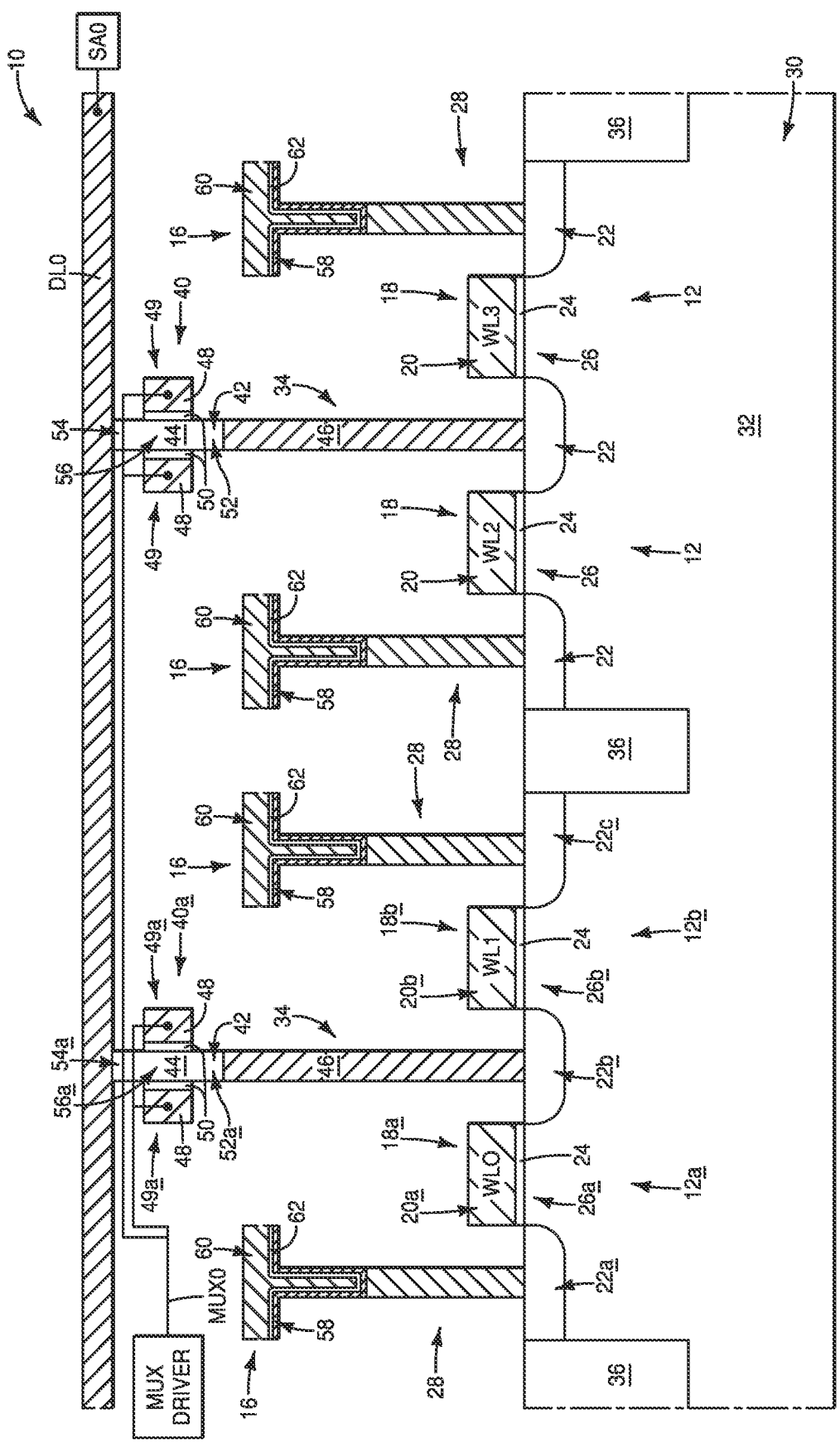
FIG. 7 is a diagrammatic cross-sectional side view showing a region of an example integrated assembly which may be within the memory array of FIG. 5, and which may be a specific example of the more generic assembly of FIG. 4.

The capacitors 16 of FIG. 4 may have any suitable configuration. FIG. 7 shows a region of the memory array 10 analogous to that of FIG. 4, but illustrating a specific example configuration of the capacitors 16. Each of the capacitors 16 comprises a first conductive node 58, a second conductive node 60, and an insulative material 62 between the first and second conductive nodes. The first and second conductive nodes 60 and 62 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The first and second conductive nodes may comprise the same composition as one another, or may comprise different compositions relative to one another. The insulative material 62 may comprise any suitable composition(s), and in some embodiments may comprise, consist essentially of, or consist of silicon dioxide.

In the shown embodiment, the lower conductive nodes 58 are configured as upwardly-opening containers. In other embodiments, the lower conductive nodes may have other suitable shapes. The lower conductive nodes 58 may be referred to as storage nodes, and the upper nodes 60 may be referred to as plate electrodes. In some embodiments, the plate electrodes within memory array 10 may all be coupled to one another, and may be coupled to a reference voltage (e.g., the common plate voltage).

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a primary access transistor. The primary access transistor has a first source/drain region and a second source/drain region. The first and second source/drain regions are coupled to one another when the primary access transistor is in an ON mode, and are not coupled to one another when the primary access transistor is in an OFF mode. A charge-storage device is coupled with the first source/drain region. A digit line is coupled with the second source/drain region through a secondary access device. The secondary access device has an ON mode and an OFF mode. The digit line is coupled with the charge-storage device only when both the primary access transistor and the secondary access device are in their respective ON modes.

Some embodiments include an integrated assembly which comprises a first primary access transistor and a second primary access transistor. The first primary access transistor comprises a first gate proximate a first channel region, and the second primary access transistor comprises a second gate proximate a second channel region. The first and second primary access transistors together comprise three source/drain regions, with one of the three source/drain regions being shared by the first and second primary access transistors. The three source/drain regions are a first source/drain region, a second source/drain region and a third source/drain region. The first and second source/drain regions are gatedly coupled to one another through the first channel region. The second and third source/drain regions are gatedly coupled to one another through the second channel region. A first charge-storage device is coupled with the first source/drain region. A second charge-storage device is coupled with the third source/drain region. A digit line is coupled with the second source/drain region through an interconnect. A switch controls current flow along the interconnect.

Some embodiments include an integrated assembly which comprises a first primary access transistor and a second primary access transistor. The first primary access transistor comprises a first gate proximate a first channel region, and the second primary access transistor comprises a second gate proximate a second channel region. The first and second primary access transistors together comprise three source/drain regions, with one of the three source/drain regions being shared by the first and second primary access transistors. The three source/drain regions are a first source/drain region, a second source/drain region and a third source/drain region. The first and second source/drain regions are gatedly coupled to one another through the first channel region. The second and third source/drain regions are gatedly coupled to one another through the second channel region. The first channel region extends horizontally between the first and second source/drain regions. The second channel region extends horizontally between the second and third source/drain regions. A first capacitor is coupled with the first source/drain region. A second capacitor is coupled with the third source/drain region. A digit line is coupled with the second source/drain region through an interconnect. The interconnect comprises a vertically-extending pillar of a semiconductor material. A secondary access transistor gates a portion of the vertically-extending pillar of the semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
    a first transistor extending in a first direction and having first and second source/drain regions;
    a second transistor extending in a second direction oriented 90 degrees different from the first direction, the second transistor comprising a third source/drain region coupled with the first source/drain region of the first transistor; and
    a charge-storage device coupled to the second source/drain region of the first transistor.

2. The integrated assembly of claim 1 further comprising a digit line coupled to a fourth source/drain region of the second transistor.

3. The integrated assembly of claim 1 wherein the first transistor and the charge-storage device together comprise a memory cell.

4. The integrated assembly of claim 3 wherein the memory cell is one of many substantially identical memory cells within a DRAM array.

5. The integrated assembly of claim 1 further comprising a third transistor sharing the first source/drain region of the first transistor.

6. An integrated assembly, comprising:
    a first transistor comprising first and second source/drain regions;
    a second transistor comprising a gate, and third and fourth source/drain regions, the first and third source/drain regions are coupled to each other and the gate is coupled to a multiplexer; and
    wherein the first transistor extends in a first direction and the second transistor extends in a second direction different from the first direction.

7. The integrated assembly of claim 6 wherein the multiplexer enables the second transistor to be independently controlled relative to the first transistor.

8. The integrated assembly of claim 7 wherein the first and second transistors are incorporated into an array of other transistors, and wherein the multiplexer enables the second transistor to be independently controlled relative to the array of other transistors.

9. The integrated assembly of claim 6 further comprising a third transistor sharing the first source/drain region of the first transistor.

10. An integrated assembly, comprising:
    a first transistor comprising first and second source/drain regions;
    a second transistor sharing the first source/drain region with the first transistor and comprising a third source/drain region;
    a third transistor comprising a fourth source/drain region coupled to the shared first source/drain region; and
    a pillar of material providing the coupling between the fourth and the shared first source/drain regions.

11. The integrated assembly of claim 10 wherein the pillar of material comprises a channel and a fifth source/drain region of the third transistor.

12. The integrated assembly of claim 10 wherein the pillar of material is coupled to a digit line.

13. The integrated assembly of claim 10 wherein the pillar of material comprises at least one of the following compositions: a metal; a metal-containing composition; and a semiconductor material.

14. The integrated assembly of claim 10 wherein the pillar of material comprises at least two of the following compositions: a metal; a metal-containing composition; and a semiconductor material.

15. The integrated assembly of claim 10 wherein at least two of the first, second and third transistors extend in different directions.

16. The integrated assembly of claim 1 further comprising a switch coupled to at least one of the first and second transistors.

17. The integrated assembly of claim 16 further comprising a multiplexer coupled to the switch.

18. The integrated assembly of claim 6 wherein the gate is coupled directly to a multiplexer without intervening connections.

19. An integrated assembly, comprising:
a first transistor extending in a first direction and having first and second source/drain regions;
a second transistor extending in a second direction oriented 90 degrees different from the first direction, the second transistor comprising a third source/drain region coupled with the first source/drain region of the first transistor; and
a switch coupled to at least one of the first and second transistors.

20. The integrated assembly of claim 19 further comprising a multiplexer coupled to the switch.

21. An integrated assembly, comprising:
a first transistor comprising first and second source/drain regions;
a second transistor comprising a gate, and third and fourth source/drain regions, the first and third source/drain regions are coupled to each other and the gate is coupled to a multiplexer; and
a third transistor sharing the first source/drain region of the first transistor.

22. An integrated assembly, comprising:
a first transistor having first and second source/drain regions, the first source/drain region coupled to a storage device;
a second transistor sharing the second source/drain region with the first transistor; and
a third transistor coupled to the shared second source/drain region.

23. The integrated assembly of claim 22 wherein the third transistor is coupled to a bitline.

24. The integrated assembly of claim 22 wherein the third transistor comprises a third source/drain region coupled to the shared second source/drain region.

25. The integrated assembly of claim 22 wherein the third transistor comprises a third source/drain region coupled to the bitline.

26. The integrated assembly of claim 22 wherein the third transistor is coupled to a wordline extending parallel to a wordline coupled to the first transistor.

27. The integrated assembly of claim 22 wherein the third transistor is coupled to a wordline extending parallel to a wordline coupled to the second transistor.

28. The integrated assembly of claim 22 wherein the third transistor is coupled to a wordline extending parallel to a first wordline coupled to the first transistor and a second wordline coupled to the second transistor.

* * * * *